United States Patent
Kao et al.

(10) Patent No.: US 7,234,019 B1
(45) Date of Patent: Jun. 19, 2007

(54) METHOD AND APPARATUS FOR IMPLEMENTING A SEARCH ENGINE USING AN SRAM

(75) Inventors: Sophia W. Kao, Cupertino, CA (US);
Govind Malalur, Fremont, CA (US);
Brian Hang Wai Yang, Monterey Park, CA (US)

(73) Assignee: Raza Microelectronics, Inc., Cupertino, CA (US)

( * ) Notice: Subject to any disclaimer, the term of this patent is extended or adjusted under 35 U.S.C. 154(b) by 532 days.

(21) Appl. No.: 10/735,107

(22) Filed: Dec. 12, 2003

(51) Int. Cl.
*G06F 12/00* (2006.01)
(52) U.S. Cl. ................. 711/5; 711/216; 707/6
(58) Field of Classification Search .......... 711/5, 711/216; 707/6
See application file for complete search history.

(56) References Cited

U.S. PATENT DOCUMENTS 5,530,834 A * 6/1996 Colloff et al. .......... 711/136
6,223,172 B1 * 4/2001 Hunter et al. ............ 707/3
7,002,965 B1 * 2/2006 Cheriton ............... 370/395.32

* cited by examiner

*Primary Examiner*—Brian R. Peugh
*Assistant Examiner*—Jared Rutz
(74) *Attorney, Agent, or Firm*—Stevens Law Group

(57) ABSTRACT

A search engine system including a memory bank coupled to a bank selection signal, mask logic for receiving constructed keys and incoming key masks and for providing masked keys, hash function blocks for receiving at least two of the masked keys and for providing at least three hash function outputs and multiplexers for receiving hash function outputs, and for providing the bank selection signal is disclosed. Also, the system can allow for local masking of the constructed keys using local mask fields. The hash function can be a Cyclic Redundancy Code (CRC) type function. The memory bank can be arranged as buckets of entries and can be implemented as a standard static random access memory (SRAM). Further, the system can be configured to operate in either a shared mode for sharing hash function outputs or a non-shared mode whereby hash function outputs can be designated for particular portions of the memory bank.

21 Claims, 7 Drawing Sheets

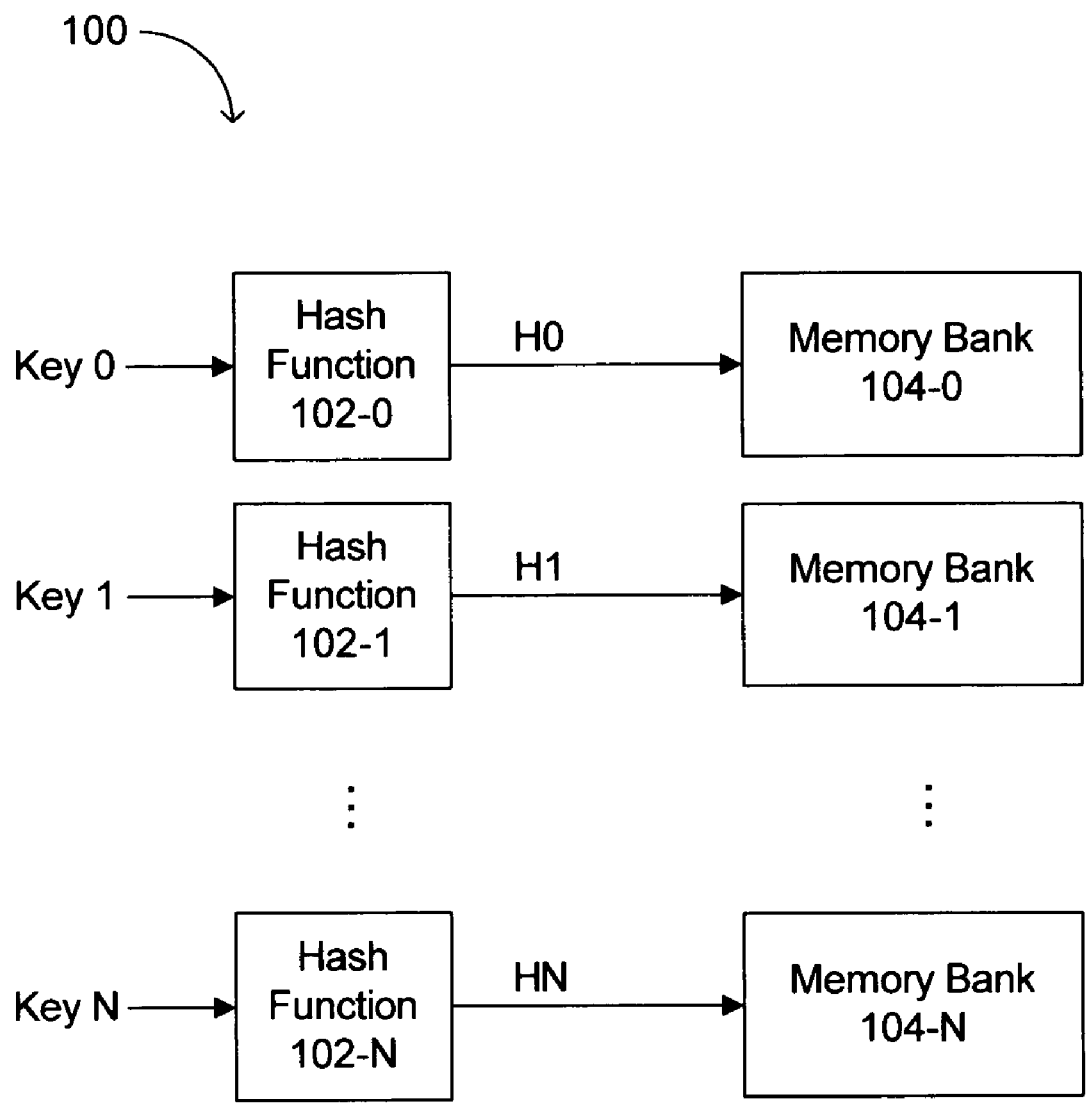
FIG. 1 (conventional)

METHOD AND APPARATUS FOR IMPLEMENTING A SEARCH ENGINE USING AN SRAM

FIELD

The invention relates generally to the field of search engines and, more particularly, to a method and apparatus for implementing a search engine using a static random access memory (SRAM).

BACKGROUND

In networking systems, routers and/or switches typically move packets of information from one of a number of input ports to one or more output ports. A lookup function, which can be implemented as a hardware "search engine" or the like, can include a content addressable memory (CAM), but this approach may be relatively expensive. Another approach is to use a standard memory, such as static random-access memory (SRAM), commonly accessed using "hashing" to essentially provide a "many-to-one" function. Such an approach can allow for a smaller memory size so that the overall system cost can be reduced.

Referring now to FIG. 1, a block diagram of a conventional search engine using hashing is shown and indicated by the general reference character 100. Hash Function 102-0 can receive Key 0 and provide hash function output H0 to Memory Bank 104-0. Similarly, Hash Function 102-1 can receive Key 1 and provide hash function output H1 to Memory Bank 104-1, and so on through Hash Function 102-N receiving Key N and providing hash function output HN to Memory Bank 104-N. In this fashion, each hash function maps to a designated memory bank or section. So, none of the entries in Memory Bank 104-0 can use a function or rule other than H0. Because different applications may require different and/or multiple rules, several of the memory banks may be under utilized in this conventional approach. Further, features commonly available in CAM-based search engines, such as key concatenation, incoming key masking, local masking, and other flexible system options are typically not provided in such conventional SRAM-based search engines.

Consequently, what is needed is a search engine solution that does not include a CAM structure, but still provides at a relatively low cost, features such as key concatenation, masking of incoming keys, local masking for each stored key, and flexibility in rule sharing through the use of different hash function outputs.

SUMMARY

The invention overcomes the identified limitations and provides a relatively low cost search engine solution with multiple advantageous features.

According to embodiments of the invention, a search engine system can include a memory bank coupled to a bank selection signal, mask logic for receiving constructed keys and incoming key masks and for providing masked keys, hash function blocks for receiving at least two of the masked keys and for providing at least three hash function outputs, and multiplexers for receiving hash function outputs and for providing the bank selection signal. Also, the system can allow for local masking of the constructed keys using local mask fields. The hash function can be a Cyclic Redundancy Code (CRC) type function. The memory bank can be arranged as buckets of entries and can be implemented as a standard static random access memory (SRAM). Further, the system can be configured to operate in either a shared mode for sharing hash function outputs or a non-shared mode whereby hash function outputs can be designated for particular portions of the memory bank.

According to another aspect of embodiments of the invention, a method of searching a table can include the step of (i) constructing keys; (ii) performing a key masking on each of the keys to provide masked keys; (iii) performing a hashing on each of the masked keys; (iv) determining if a system is in a shared mode; (v) if the system is in the shared mode, sharing hash functions for an entry of a memory bank, but if the system is not in the shared mode, hard configuring the hash functions for the entry of the memory bank; (vi) selecting a bucket from the memory bank; (vii) performing a comparison to provide one or more match indications; and (viii) determining a precedence from among the one or more match indications.

Advantages of the invention include providing a relatively low cost search engine system with features such as key concatenation, masking of incoming keys, local masking for each stored key, and shared rule or fixed rule mode operation.

BRIEF DESCRIPTION OF THE FIGURES

Embodiments of the invention are described with reference to the FIGS, in which:

FIG. 1 is a block diagram of a conventional search engine using hashing;

DETAILED DESCRIPTION

Embodiments of the invention are described with reference to specific diagrams depicting system arrangements and methods. Those skilled in the art will recognize that the description is for illustration and to provide the best mode of practicing the invention. The description is not meant to be limiting. For example, reference is made to specific hash function generator types, such as Cyclic Redundancy Code (CRC), but the invention is applicable to other types of functions and/or mappings as well. Also, memory bank fields and/or arrangements thereof in a system merely provide example implementations and should not be construed as limiting. Further, while a specific number of key construction portions as well as a number of memory banks in a system are shown, those skilled in the art will recognize that the invention is applicable to other numbers of key constructions and/or memory banks or the like as well.

Figure 2:
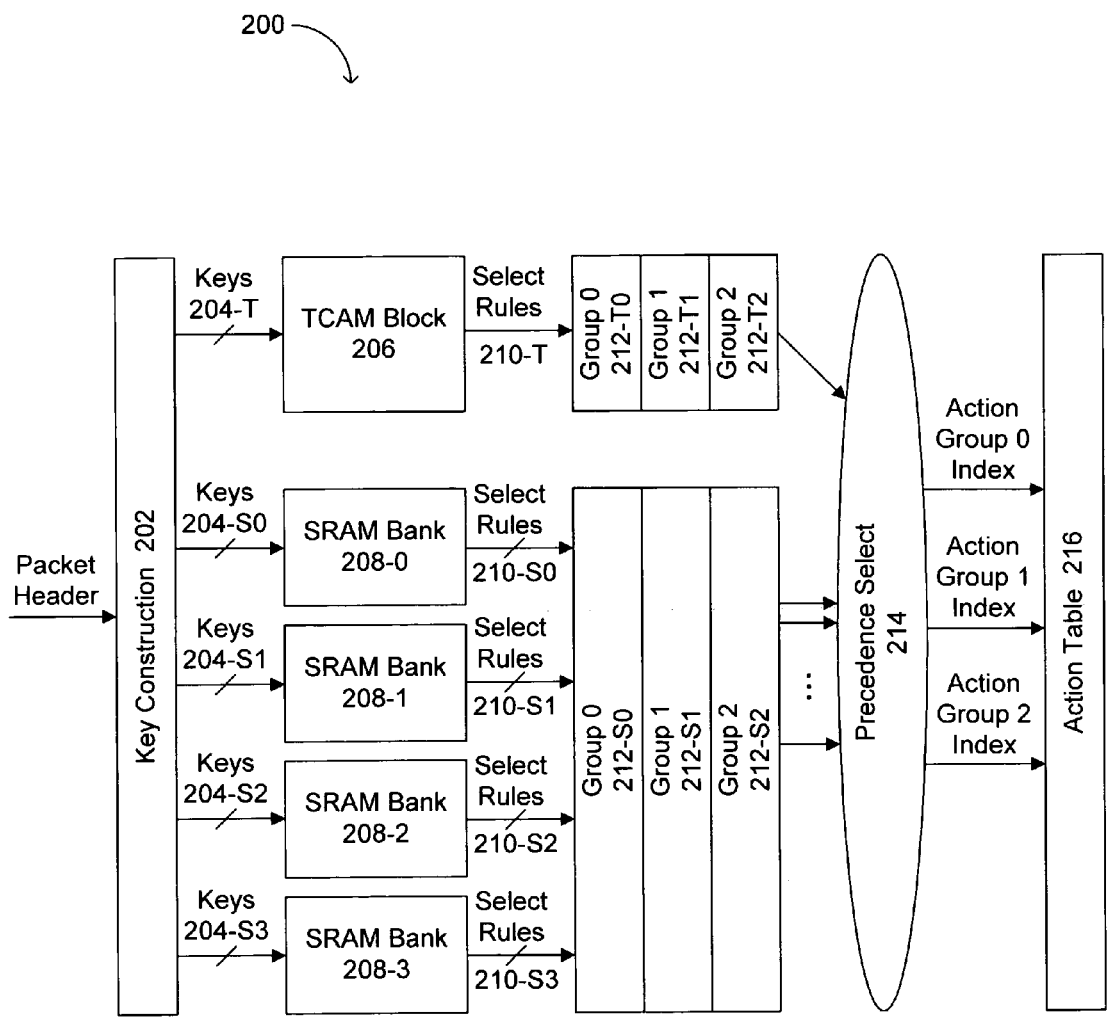
FIG. 2 is a block diagram of a classification engine according to an embodiment of the invention.

Referring now to FIG. 2, a block diagram of a classification engine according to an embodiment of the invention is shown and indicated by the general reference character 200. A Packet Header can be received by block Key Construction 202. Accordingly, the constructed keys can include information taken from a packet. For example, if an incoming packet header is up to 140B long, 16 constructed keys of 256-bits each may be parsed from the packet. The searching of these 16 constructed keys can then be done essentially in parallel fashion. Examples of types of packets that can be used for key construction include Internet Protocol (IP) and Media Access Control (MAC) type addresses. Further, other sources for constructed keys can include, for example, packet attributes identified and/or assigned by a packet parser, programmable offset values extracted from packet headers, predefined protocol fields, and/or packet profiles. Here, embodiments may provide a classification engine function whereby a packet header can be matched with a particular rule.

In FIG. 2, Key Construction 202 can provide Keys 204-T to TCAM Block 206, Keys 204-S0 to SRAM Bank 208-0, Keys 204-S1 to SRAM Bank 208-1, Keys 204-S2 to SRAM Bank 208-2, and Keys 204-S3 to SRAM Bank 208-3. A search result from TCAM Block 206 can include Select Rules 210-T provided to Group 0 212-T0, Group 1 212-T1, or Group 2 212-T2, depending on the group designation of the search, for example. Search results from the SRAM banks can include Select Rules 210-S0 from SRAM Bank 208-0, Select Rules 210-S1 from SRAM Bank 208-1, Select Rules 210-S2 from SRAM Bank 208-2, and Select Rules 210-S3 from SRAM Bank 208-3, for example. Each of these search results from the SRAM banks can be provided to Group 0 212-S0, Group 1 212-S1, or Group 2 212-S2, depending on the group designation of the search, for example. For each of the groups, search results including the appropriate precedence levels, can be provided to Precedence Select 214, which can determine a "winner" or overall priority hit search result for each group. Action Table 216 can receive the winning index for groups 0, 1, and 2: Action Group 0 Index, Action Group 1 Index, and Action Group 2 Index, respectively.

Figure 3:
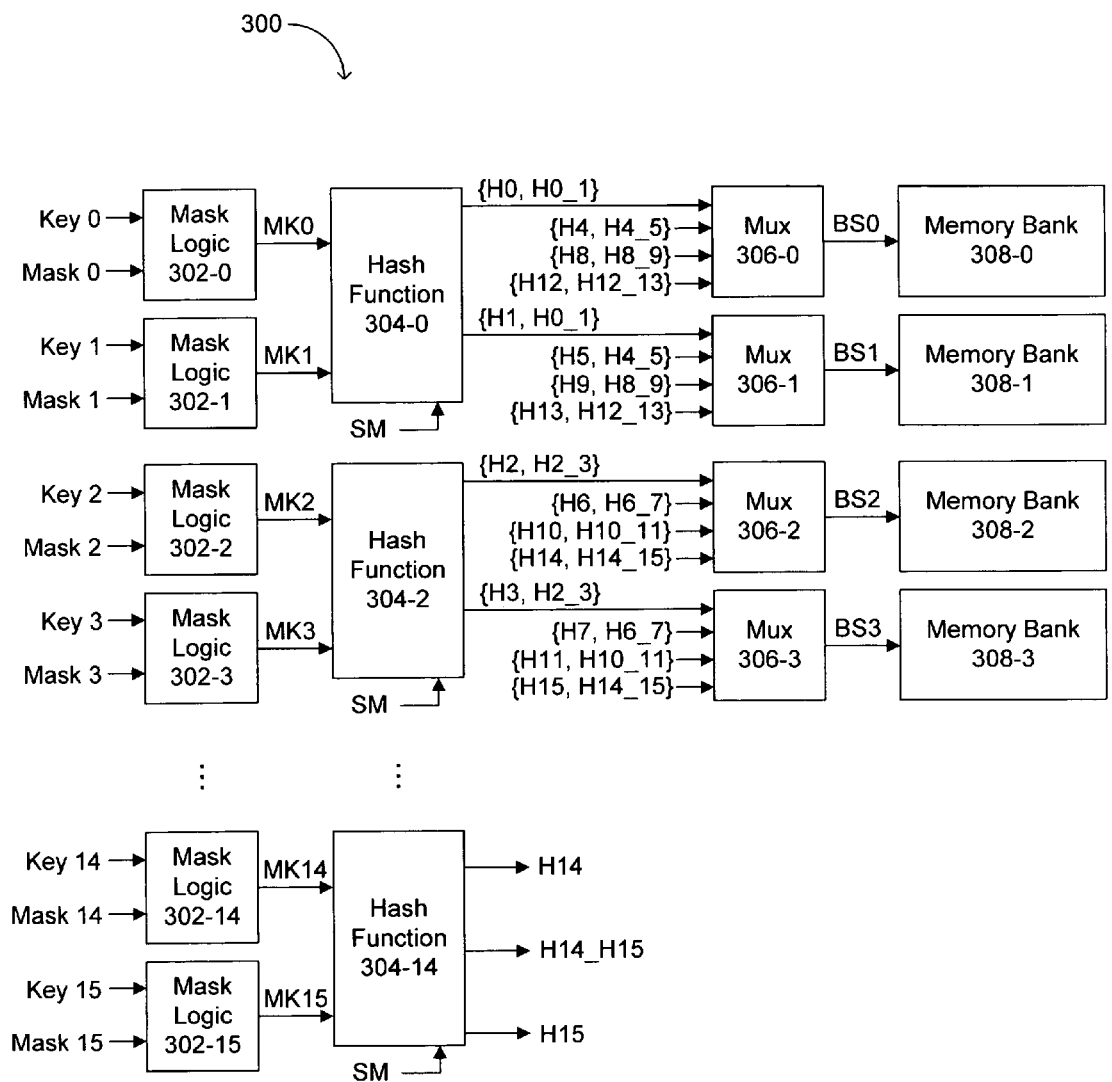
FIG. 3 is a block diagram of a search engine system according to an embodiment of the invention.

Referring now to FIG. 3, a block diagram of a search engine system according to an embodiment of the invention is shown and indicated by the general reference character 300. In this very particular example, four memory banks and sixteen key construction portions are shown, but other numbers of key construction and/or memory banks could also be used according to embodiments of the invention. In FIG. 3, constructed Key 0 and incoming key mask Mask 0 can be received by Mask Logic 302-0. Mask Logic 302-0 can provide masked key MK0 to Hash Function 304-0. Similarly, constructed key Key 1 and incoming key mask Mask 1 can be received by Mask Logic 302-1, which can also provide masked key MK1 to Hash Function 302-0. The hash function can provide at least three hash function outputs: H0, H1, and H0_1. Further, each hash function can receive shared mode signal "SM" to indicate a shared housing mode or a fixed/designated hashing mode of operation, as will be discussed in more detail below. H0 can represent a hashing of MK0, H1 can represent a hashing of MK1, and H0$_{-1}$ can represent a hashing of a concatenation of MK0 and MK1. A similar arrangement can be formed by Mask Logic 302-2, which can receive Key 2 and Mask 2 and provide MK2, Mask Logic 302-3, which can receive Key 3 and Mask 3 and provide MK3, and Hash Function 304-2, which can receive MK2, MK3, and provide H2, H3, and H2_3. This arrangement can be repeated through the maximum number of key constructions available in the system. In this very particular example, 16 key construction are available. Accordingly, the arrangements can repeat through that formed by Mask Logic 302-14, which can receive Key 14 and Mask 14 and provide MK14, Mask Logic 302-15, which can receive Key 15 and Mask 15 and provide MK15, and Hash Function 304-14, which can receive MK14, MK15, and provide H14, H15, and H14_15.

In the particular example shown in FIG. 3, four memory banks, each with associated multiplexers are shown, but those skilled in the art will recognize that more or less banks may be used in implementations according to embodiments of the invention. In FIG. 3, Memory Bank 308-0 can receive bank selection signal BS0 from Mux 306-0. Mux 306-0 can receive several hash output signals: {H0, H0_1}, {H4, H4_5}, {H8, H8_9}, and {H12, H12_13}. Accordingly, Memory Banks 308-0 is generally associated with hash function outputs numbered 0, 4, 8, and 12. Similarly, Memory Bank 308-1 can receive bank selection bank signal BS1 from Mux 306-1, which can receive has output signals: {H1, H0_1}, {H5, H4_5}, {H9, H8_9}, and {H13, H12_13}. Accordingly, Memory Bank 308-1 is generally associated with hash function outputs numbered 1, 5, 9, and 13. Also, Memory Bank 208-2 can receive bank selection signal BS2 from Mux 306-2, which can receive hash output signals: {H2, H2_3}, {H6, H6_7}, {H10, H10_11}, and {H14, H14_15}. Accordingly, Memory Bank 308-2 is generally associated with hash function outputs numbered 2, 6, 10, and 14. Similarly, Memory Bank 308-3 can receive bank selection signal BS3 from Mux 306-3, which can receive hash output signals: {H3, H2_3}, {H7, H6_7}, {H11, H10_11}, and {H15, H14_15}. Accordingly, Memory Bank 308-3 is generally associated with hash function outputs numbered 3, 7, 11, and 15. In this fashion, four hash functions or rules can be available for each memory bank.

Figure 4:
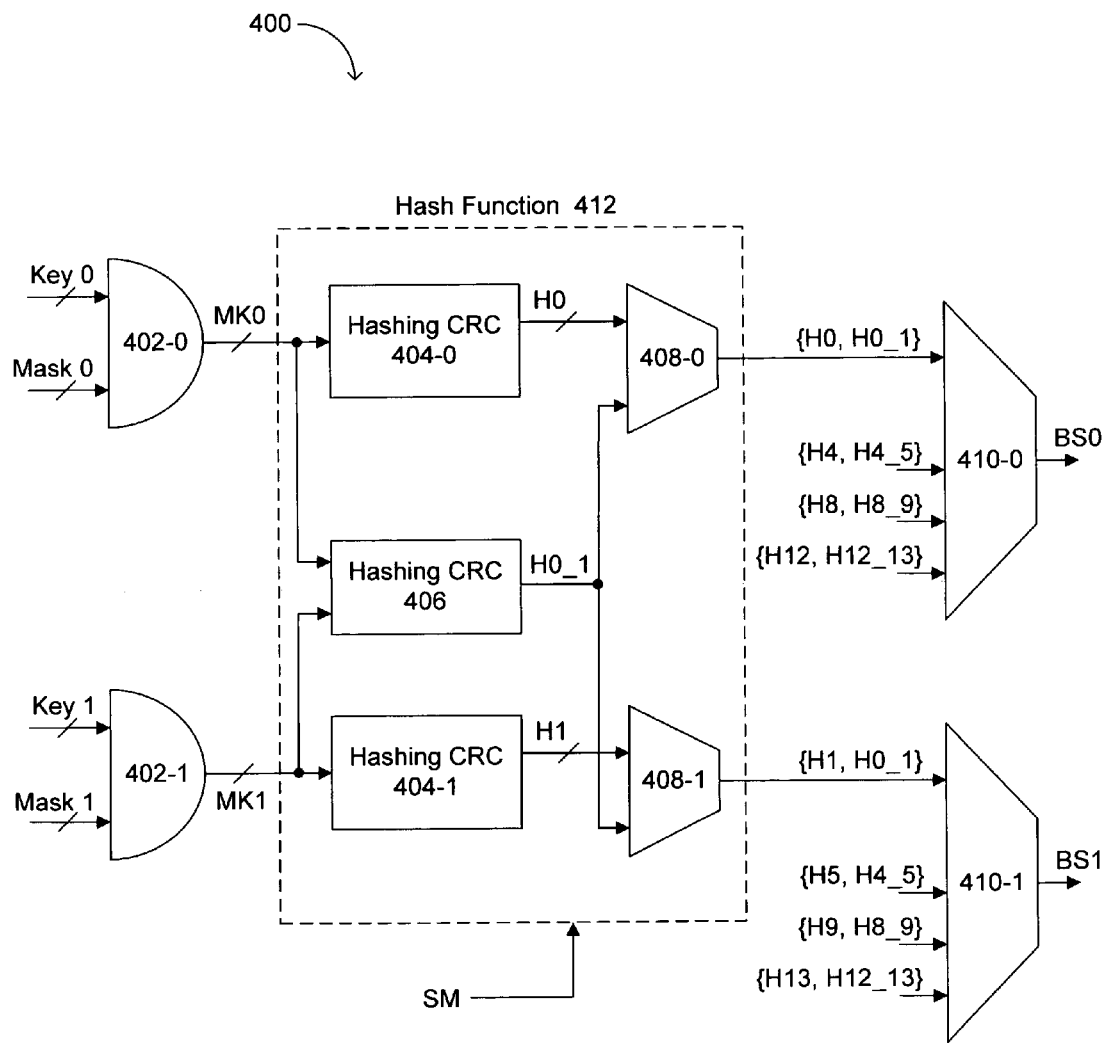
FIG. 4 is a detailed block diagrams of a memory bank selection system according to an embodiment of the invention.

Referring now to FIG. 4, a detailed block diagram of a memory bank selection system according to an embodiment of the invention is shown and indicated by the general reference character 400. This diagram can represent more detail for several of the blocks shown in FIG. 3. For example, blocks Mask Logic 302-0 and 302-1 of FIG. 3 can correspond to logic gates 402-0 and 402-1, respectively, of FIG. 4. Also, Hash Function 304-0 of FIG. 3 can correspond to hash Function 412 of FIG. 4. Also, multiplexers Mux 306-0 and 306-1 of FIG. 3 can correspond to multiplexer 410-0 and multiplexer 410-1, respectively, of FIG. 4. While one example of more detailed implementation of the blocks of FIG. 3 is shown in FIG. 4, those skilled in the art will recognize that other possible implementations can be used according to embodiments of the invention.

In FIG. 4, logic gate 402-0 can receive constructed key Key 0 and incoming key mask Mask 0. Logic gate 402-0 can provide a logical-AND type function on a bit-by-bit basis. Accordingly, for Mask 0 bit positions that have a "0" value, the corresponding bit positions in the Key 0 will be masked-out when forming masked key MK0. For example, if Key 0=01010100 and Mask 0=00001111, MK0 would be 00000100. Similar masks can be performed by logic gate 402-1 on constructed key Key 1 with reference to incoming key mask Mask 1 to provide masked key. Of course, an all-bit type matching can be done by using incoming key mask values of all "1" states. But, such masking functions may become more important as the width of a key increases so that certain fields of the key may be isolated.

Hash Function 412 shown in FIG. 4, can include Hashing CRC 404-0, which can receive masked key MK0 and provide hash function output H0. The CRC function can provide a "many-to-one" mapping function. In one example, MK0 may have a width of 256-bits and H0 may have a width of 8-bits to allow for $2^8$=256 unique addressable locations. In a shared mode of operation (e.g., as indicated by a state of the SM signal), however, 2 of the 8 bits may be fixed by the hashing function. Also, Hashing CRC 404-1 can receive masked key MK1 and provide hash function output H1. For concatenated entry searching. Hashing CRC 406 can be used to provide hash function output H0_1 in response to MK0 and MK1. If the search to be performed by the search engine system is on non-concatenated entries, hash function output H0 may pass through multiplexer 408-0 (i.e., concatenated key multiplexer stage) and hash function output H1 may pass through multiplexer 408-1, for example. However, if the search is to be performed on concatenated entries so that the entries are effectively twice as wide as non-concatenated, hash function output H0_1 may pass through both multiplexers 408-0 and 408-1. Accordingly, wider width searches may be performed by concatenating each entry from Memory Bank 0 with a corresponding entry in Memory Bank 1, for example. Further, such concatenation requires a comparison of corresponding entry match indications from both Memory Bank 0 and Memory Bank 1 in order to determine a concatenated entry match condition.

In FIG. 4, multiplexers 410-0 and 410-1 (i.e., hash function output select multiplexer stage) can each receive multiple hash function outputs and provide bank selection signals BS0 and BS1, respectively. Multiplexer 410-0 may provide BS0 in response to one of: {H0, H0_1}, {H4, H4_5}, {H8, H8_9}, and {H12, H12_13}. Similarly, multiplexers 410-1 may provide BS1 in response to one of: {H1, H0_1}, {H5, H4_5}, {H9, H8_9}, and {H13, H12_13}. As one example, in a non-concatenated search, BS0 may change from H0 to H4 to H8 to H12 in successive clock cycles so as to accommodate a packet in four clock cycles. Similarly, as one example for a concatenated search, BS0 may change from H0_1 to H4_5 to H8$_{13}$ 9 to H12_13 in successive clock cycles. Of course, as will be recognized by those skilled in the art, any suitable sequencing may be used according to embodiments of the invention.

Figure 5:
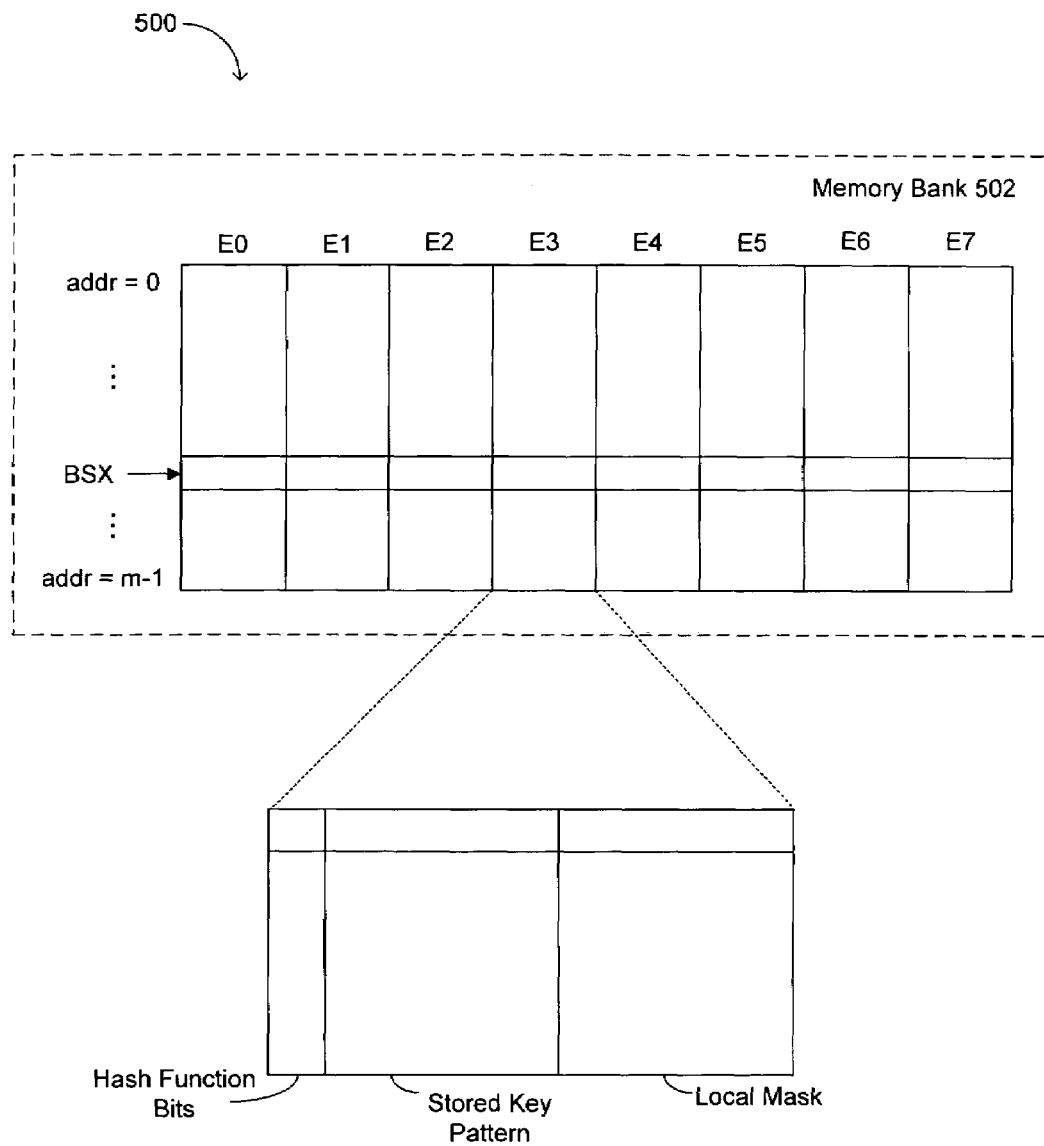
FIG. 5 is a diagram of a memory bank arrangement according to an embodiment of the invention.

Referring now to FIG. 5, a diagram of a memory bank arrangement according to an embodiment of the invention is shown and indicated by the general reference character 500. Memory Bank 502 may be arranged as a plurality of "buckets" addressable by "addr=0" through "addre=m−1" for "m" total buckets in the bank. Bank selection signal BSX may correspond to a selected bucket in the memory bank. Further, each bucket may contain a number of "entries." In this very particular example, eight entries (E0, E1, . . . E7) are shown and each entry may contain fields, such as Hash Function Bits, Stored Key Pattern, and Local Mask. The Local Mask may be used to mask the incoming key on a bit-by-bit and/or field basis. Further, "valid" bits (not shown) may be included and associated with different entry fields.

According to embodiments of the invention, the search engine can generally be operated in one of two modes: shared hashing or fixed/designated hashing. For shared hashing, each stored entry can be associated with one of up to four hash function outputs or rules. With reference to FIGS. 3 and 4, any entry from Memory Bank 308-0 can be associated with hash function outputs H0, H4, H8, and H12, for example. Similarly, any entry from Memory Bank 308-1 can be associated with hash function outputs H1, H5, H9, and H13, for example. Also, any entry from Memory Bank 308-2 can be associated with hash function outputs H2, H6, H10, and H14, for example. Similarly, any entry from Memory Bank 308-3 can be associated with hash function outputs H3, H7, H11, and H15, for example. In this fashion, the number of rules available for each stored entry can be maximized according to overall system requirements.

Referring back to FIG. 5, in order to distinguish which of the four hash function outputs associated with a particular memory bank were used when storing a given Stored Key, the Hash Function Bits can be used. Accordingly, Hash Function Bits="00" may indicate the entry was stored or uses the rule corresponding to hash function output H0. Similarly, Hash Function Bits="01" may indicate H4, "10" may indicate H8, and "11" may indicate H12, for example. However, if the search engine is being operated in a fixed/designated hashing mode, these Hash Function Bits can become "don't care" terms. In the fixed/designated hashing mode, each entry is "hard configured" or designated to a particular one of the associated four hashing function outputs. As discussed above, such hard configuring may be implemented in part by fixing 2 of the 8 bits provided by the hashing function.

Figure 6:
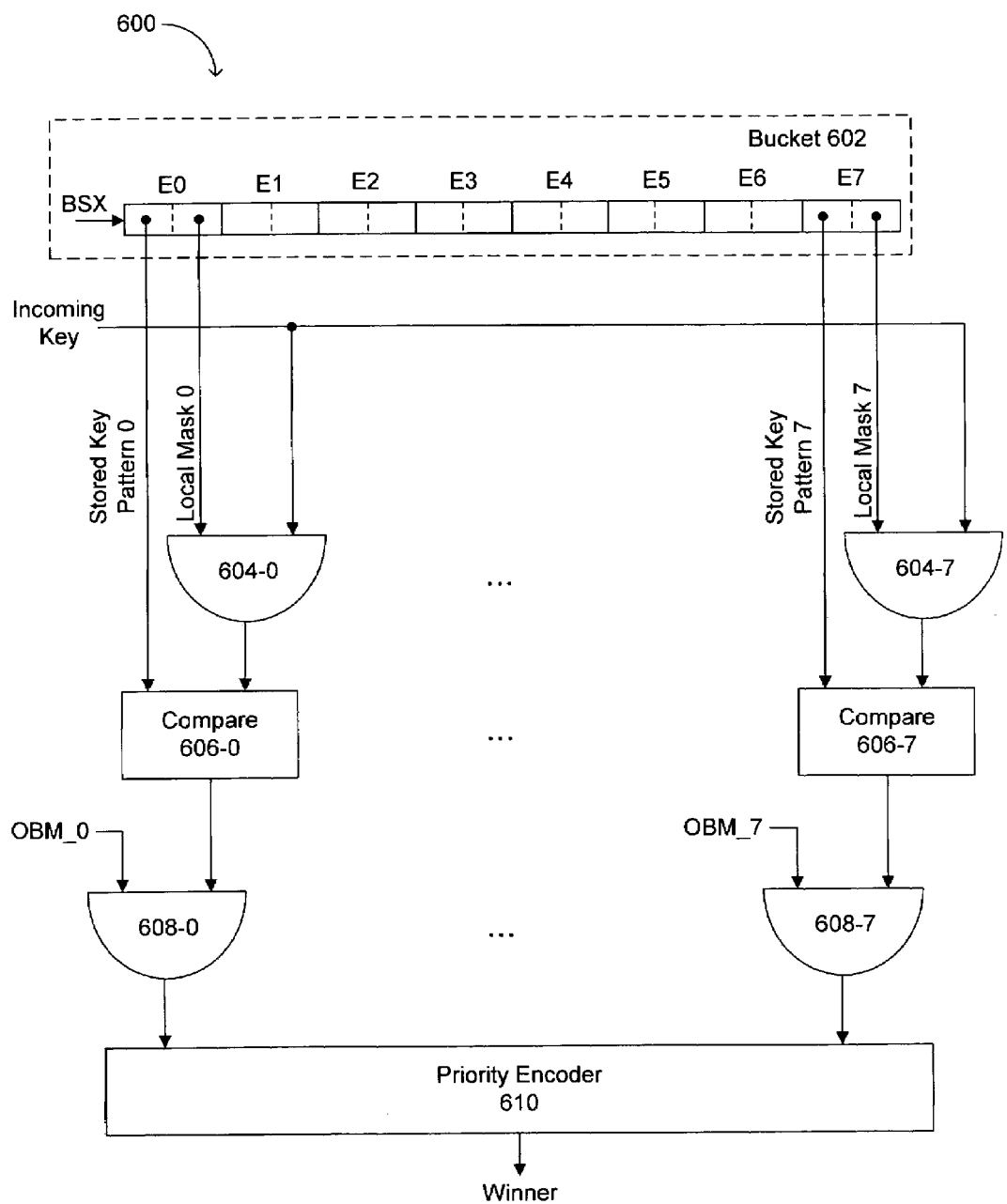
FIG. 6 is a diagram of entry comparison for a selected bucket according to an embodiment of the invention.

Referring now to FIG. 6, a diagram of entry comparison for a selected bucket according to an embodiment of the invention is shown and indicated by the general reference character 600. Bucket 602 can include entries E0–E7, as discussed above with reference to FIG. 5. Once a bucket is selected, each such entry can be used in a comparison with Incoming Key, which can correspond to one of the constructed keys discussed above. In FIG. 6, Incoming Key can connect to AND-function blocks 604-0 through 604-7, with one corresponding to each entry of the bucket. A second input of AND-function block 604-0 can receive Local Mask 0. Similarly, each entry's local mask can connect to a corresponding AND-function block, as shown with Local Mask 7 connecting to AND-functional block 604-7. Accordingly, the local mask values from the local mask field can be applied to perform another level of bit-by-bit and/or field masking, as described above, on the incoming or constructed key.

Each AND-function output 604-0 through 604-7 can provide an input to corresponding Compare 606-0 through 606-7 blocks. The associated stored key patterns (Stored Key Pattern 0 through Stored Key Pattern 7) can provide a second input to the compare blocks. In this fashion, the "stored" keys can be effectively compared against the incoming key, subject to local mask application. Accordingly, Compare 606-0 through 606-7 outputs can indicate a match or mismatch state for each of the entries of the selected bucket. To accommodate the concatenated entry mode, another set of AND-functions 608-0 through 608-7 can be used. Each of 608-0 through 608-7 can receive a match signal from the local computer block as well as a corresponding match signal from the associated entry of another bank. Other Bank Match (OBM) signals OBM_O through OBM_7. Each AND function block 608-0 through 608-7 can provide an output to Priority Encoder 610 in order to decide a "Winner" for the entries of the selected bucket.

Figure 7:
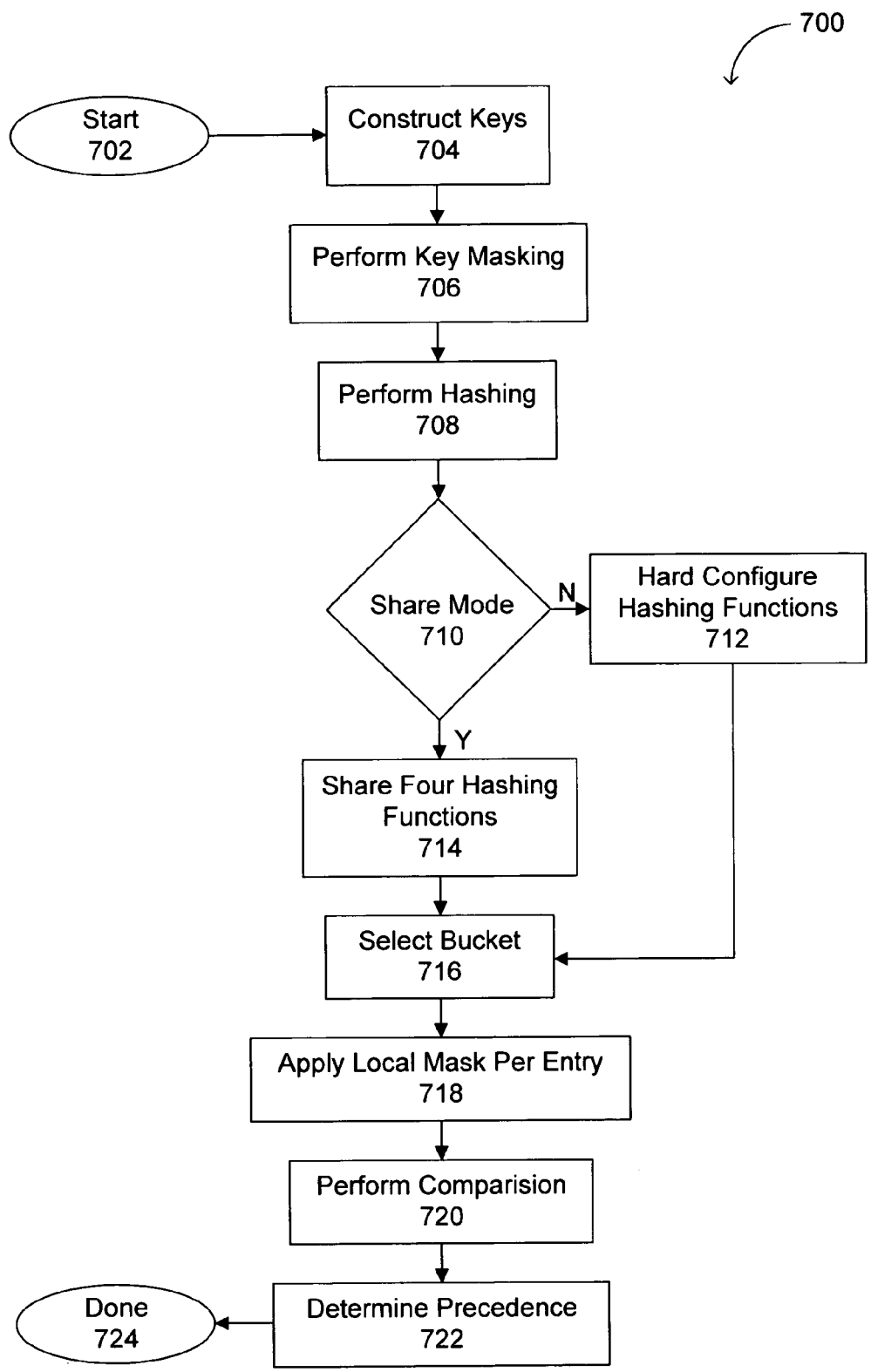
FIG. 7 is a flow diagram of a method of searching a table according to embodiments of the invention.

Referring now to FIG. 7, a flow diagram of a method of searching a table according to embodiments of the invention is shown and indicated by the general reference character 700. The method can begin in Start 702 and the flow can proceed to step Construct Keys 704. The constructing of the keys can include getting information from a packet, for example. Next, the flow can proceed to step Perform Key Masking 706. Depending on the mask used, this step can include bit-by-bit, field, or no masking to allow for a search on all bits or fields of an entry. Next, the flow can proceed to step Perform Hashing 708. The hashing function can include, for example, a CRC many-to-one function application. Next, the flow can proceed to decision box Shared Mode 710. If the system is in fixed/designated hashing mode, the flow can proceed to step Hard Configure hashing Functions 712 and then to step Select Bucket 716. In the fixed/designated mode, each entry may be strictly designated to a particular hashing function output or rule. However, if the system is in a shared hashing mode, the flow can instead proceed to step Share Four Hashing Functions 714 and then to step Select Bucket 716. In the shared hashing mode, one of four different hashing function outputs or rules may be applied to a particular stored entry. Next, the flow can proceed to step Apply Local Mask Per Entry 718, which can include such operation as discussed above with reference to FIG. 6. Next, the flow can proceed to step Perform Comparison 720, which can include a comparison between an original constructed key and a selected stored key, subject to its associated local mask and valid field values, to provide a match indication. Next, the flow can proceed to step Determine Precedence 722, which can include determining a lowest rule precedence number (i.e., a highest priority rule) for selecting an overall "winning" match. The flow can complete in Done 724.

Advantages of the invention include providing a relatively low cost search engine system with features such as key concatenation, masking of incoming keys, local masking for each stored key, and shared rule or fixed rule mode operation.

Having disclosed exemplary embodiments and the best mode, modifications and variations may be made to the disclosed embodiments while remaining within the subject and spirit of the invention as defined by the following claims.

The invention claimed is:

1. A search engine system, comprising:
 a memory bank coupled to a bank selection signal;
 a plurality of mask logic blocks, wherein each mask logic block is configured to receive a constructed key and an incoming key mask and to provide a masked key;
 a plurality of hash function blocks, wherein each hash function block is configured to receive at least two of the masked keys and to provide at least three hash function outputs; and
 a multiplex configured to receive a plurality of hash function outputs and to provide the bank selection signal.

2. The search engine system of claim 1, wherein:
 the memory bank includes memory that is static random access memory (SRAM) type.

3. The search engine system of claim 1, wherein:
 the memory bank is arranged as a plurality of buckets, wherein each bucket includes a plurality of entries.

4. The search engine system of claim 3, wherein:
 the bank selection signal is configured to select one of the plurality of buckets.

5. The search engine system of claim 3, wherein:
 each of the plurality of entries includes a stored key pattern field, a local mask field, and a hash function indication field.

6. The search engine system of claim 5, further comprising:
 a comparator configured to provide a match indication for each of the plurality of entries in response to a comparison between the constructed key and the stored key pattern.

7. The search engine system of claim 6, wherein:
 the comparator includes an AND-function block configured to provide a masking of the constructed key by applying the local mask field.

8. The search engine system of claim 3, wherein:
 in a first mode, each of the plurality of entries is configured to be responsive to any of the plurality of hash function outputs; and
 in a second mode, each of the plurality of entries is configured to be responsive to a designated one of the plurality of hash function outputs.

9. The search engine system of claim 1, wherein:
 the constructed key includes information from a packet header.

10. The search engine system of claim 1, wherein:
 each of the plurality of mask logic blocks includes a logical-AND type function.

11. The search engine system of claim 1, wherein:
 each of the plurality of hash function blocks includes:
 a first hash function generator configure to receive a first masked key and to provide a first hash function output;
 a second hash function generator configured to receive a second masked key and to provide a second hash function output; and
 a third hash function generator configured to receive the first masked key and the second masked key and to provide a third hash function output.

12. The search engine system of claim 11, wherein:
 the third hash function output is configured for a concatenated key type search.

13. The search engine system of claim 12, wherein:
 the concatenated key type search includes a same address selection in a first memory bank and a second memory bank.

14. The search engine system of claim 11, wherein:
 each of the first, second, and third hash function generators include a Cyclic Redundancy Code (CRC) type function.

15. The search engine system of claim 1, wherein:
 the multiplexer is configured to receive at least eight hash function outputs.

16. The search engine system of claim 15, wherein:
 the at least eight hash function outputs includes outputs from at least four different hash function blocks.

17. The search engine system of claim 16, wherein:
 the multiplexer is configured to select a different one of the outputs from the at least four different hash function blocks in response to a clock signal.

18. A method of searching a table populated with a plurality of entries, comprising the steps of:
 constructing a plurality of keys;
 performing a key masking on each of the plurality of keys to provide a plurality of masked keys, wherein the plurality of masked keys provide for a bit-by-bit search of the plurality of entries;
 performing a hashing on each of the plurality of masked keys;
 determining if a system is in a shared mode;
 if the system is in the shared mode, sharing a plurality of hash functions for an entry of a memory bank;
 if the system is not in the shared mode, hard configuring the hash functions for the entry of the memory bank;
 selecting a bucket from the memory bank, wherein the bucket includes the plurality of entries;
 applying a local mask;
 performing a comparison to provide one or more match indications;
 determining a precedence from among the one or more match indications; and
 selecting a match from the one or more match indications based on the precedence, the match corresponding to one of the plurality of entries.

19. The method of searching the table of claim 18, wherein:
 the constructing the plurality of keys includes getting information from a packet.

20. The method of searching the table of claim 18, wherein:
 the performing the hashing includes using a Cyclic Redundancy Code (CRC) type function.

21. The method of claim 18 wherein the plurality of masked keys further provide for a field search of the plurality of entries.

* * * * *